(12) United States Patent
Cho et al.

(10) Patent No.: US 10,446,797 B2
(45) Date of Patent: Oct. 15, 2019

(54) POLYMER DISPERSED LIQUID CRYSTAL FILM COMPRISING AN OPTICAL LENS HAVING A FIRST LENS AREA AND A SECOND LENS AREA AND FLAT PANEL DISPLAY DEVICE HAVING THE SAME

(71) Applicant: Samsung Display Co., Ltd., Yongin-si, Gyeonggi-do (KR)

(72) Inventors: Chio Cho, Gwangju (KR); Jaejoong Kwon, Suwon-si (KR); Yunseon Do, Hwaseong-si (KR); Byungchoon Yang, Seoul (KR); Hyesog Lee, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 533 days.

(21) Appl. No.: 15/097,191

(22) Filed: Apr. 12, 2016

(65) Prior Publication Data

US 2016/0363700 A1 Dec. 15, 2016

(30) Foreign Application Priority Data

Jun. 9, 2015 (KR) .................. 10-2015-0081188

(51) Int. Cl.
| | |
|---|---|
| *H01L 51/52* | (2006.01) |
| *G02F 1/1334* | (2006.01) |
| *G02B 3/00* | (2006.01) |
| *G02B 5/30* | (2006.01) |
| *G02B 27/22* | (2018.01) |
| *G02F 1/29* | (2006.01) |

(52) U.S. Cl.
CPC ........ *H01L 51/5275* (2013.01); *G02B 3/0087* (2013.01); *G02B 5/3016* (2013.01); *G02F 1/1334* (2013.01); *G02B 27/2214* (2013.01); *G02F 1/292* (2013.01)

(58) Field of Classification Search
CPC ........ G02B 3/13; H01L 51/5275; G02F 1/292
See application file for complete search history.

(56) References Cited

U.S. PATENT DOCUMENTS

| | | | | |
|---|---|---|---|---|
| 6,864,931 | B1 * | 3/2005 | Kumar | ................. G02B 3/0006 349/188 |
| 7,079,203 | B1 * | 7/2006 | Huang | .................. G02F 1/1334 349/200 |

(Continued)

FOREIGN PATENT DOCUMENTS

| | | |
|---|---|---|
| JP | 2008-052837 A | 3/2008 |
| KR | 10-2012-0038649 A | 4/2012 |

OTHER PUBLICATIONS

Ren et al., "Tunable-focus microlens arrays using nanosized polymer-dispersed liquid crystal droplets", Optics Communications, 2005, pp. 101-106, vol. 247, Elsevier.

*Primary Examiner* — Paul C Lee
(74) *Attorney, Agent, or Firm* — Lewis Roca Rothgerber Christie LLP (57) ABSTRACT

There is provided a polymer dispersed liquid crystal film including a resin base, an optical lens on the resin base and including polymer dispersed liquid crystal particles within the resin base, and having a first lens area having a higher refractive index at an edge of the first lens area than at a center of the first lens area, and a second lens area surrounding the first lens area and having a lower refractive index at an outer edge of the second lens area than at an inner edge of the second lens area.

19 Claims, 4 Drawing Sheets

(56) References Cited

U.S. PATENT DOCUMENTS

| | | |
|---|---|---|
| 7,710,657 B2 | 5/2010 | Hamada |
| 2008/0049172 A1 | 2/2008 | Sasabe et al. |
| 2009/0052048 A1 | 2/2009 | Hamada |
| 2011/0085107 A1* | 4/2011 | Noh .................... G02B 6/0085 349/61 |
| 2015/0268495 A1* | 9/2015 | Kizaki ................ G02F 1/1337 349/33 |

* cited by examiner

POLYMER DISPERSED LIQUID CRYSTAL FILM COMPRISING AN OPTICAL LENS HAVING A FIRST LENS AREA AND A SECOND LENS AREA AND FLAT PANEL DISPLAY DEVICE HAVING THE SAME

CROSS-REFERENCE TO RELATED APPLICATION

This application claims priority to, and the benefit of, Korean Patent Application No. 10-2015-0081188, filed on Jun. 9, 2015, with the Korean Intellectual Property Office, the disclosure of which is incorporated herein in its entirety by reference.

BACKGROUND

1. Field

Aspects of embodiments of the present invention relate to a refractive-index lens film capable of improving uniformity of image quality.

2. Description of the Related Art

With advancement in the information-oriented society, a need has arisen for flat panel display ("FPD") devices that have excellent characteristics, such as slimness, light weight, low power consumption. Among various types of FPD devices, an organic light emitting diode ("OLED") display device is a self-emission-type display device that displays an image using an OLED that may emit light. By virtue of its excellent characteristics, such as low power consumption, high luminance, high response speed, and the like, the OLED display devices are garnering attention.

In general, the OLED includes an anode electrode and a cathode electrode opposing each other, and an organic layer interposed therebetween. In addition, the organic layer includes an organic light emitting layer. Holes provided from the anode electrode and electrons provided from the cathode electrode combine with each other to form an exciton in the organic light emitting layer. The OLED emits light by energy generated when the exciton falls to the ground state.

It is to be understood that this background section is intended to provide a useful background for understanding the technology, and as such, may include ideas, concepts or recognitions that were not part of what was known or appreciated by those skilled in the pertinent art prior to a corresponding effective filing date of the subject matter disclosed herein.

SUMMARY

Aspects of embodiments of the present invention are directed to a polymer optical film capable of adjusting a refractive index based on a density of liquid crystal particles dispersed within a polymer resin.

According to some exemplary embodiments of the present invention, there is provided a polymer dispersed liquid crystal film including: a resin base; an optical lens on the resin base and including polymer dispersed liquid crystal particles within the resin base, and having: a first lens area having a higher refractive index at an edge of the first lens area than at a center of the first lens area; and a second lens area surrounding the first lens area and having a lower refractive index at an outer edge of the second lens area than at an inner edge of the second lens area.

In an embodiment, density of the polymer dispersed liquid crystal particles in the optical lens increases from the center of the first lens area toward the edge of the first lens area.

In an embodiment, density of the polymer dispersed liquid crystal particles in the optical lens decreases from the center inner edge of the second lens area toward the outer edge of the second lens area.

In an embodiment, polymer dispersed liquid crystal particles in a base area between the optical lens and another optical lens have a substantially uniform density.

In an embodiment, the base area has a refractive index between a minimum refractive index of the first lens area of the optical lens and a maximum refractive index thereof.

In an embodiment, the density of the polymer dispersed liquid crystal particles in the base area has a value between a minimum density of the optical lens and a maximum density thereof.

In an embodiment, a thickness of the optical lens is about 100 μm or less.

In an embodiment, the resin base is photocurable.

In an embodiment, the resin base includes at least one of polyester, epoxy, urethane, polyether, and polyacryl.

In an embodiment, a dispersibility of the polymer dispersed liquid crystal particles is in a range of about 20 wt % to about 40 wt %.

According to some exemplary embodiments of the present invention, there is provided a flat panel display device including: a resin base; a polymer dispersed liquid crystal film including an optical lens on the resin base, and including polymer dispersed liquid crystal particles dispersed within the resin base; and a display panel attached to the polymer dispersed liquid crystal film.

In an embodiment, the optical lens has: a first lens area having a higher refractive index at an edge of the first lens area than at a center of the first lens area; and a second lens area surrounding the first lens area, and having a lower refractive index at an outer edge of the second lens area than at an inner edge of the second lens area.

In an embodiment, a base area between the optical lens and another optical lens has a uniform refractive index.

In an embodiment, the optical lenses are arranged in an array form within the polymer dispersed liquid crystal film.

In an embodiment, the resin base includes a photocurable resin.

In an embodiment, the resin base is cured through at least two light exposures.

In an embodiment, the resin base is partially cured using a mask one or more times.

In an embodiment, the polymer dispersed liquid crystal film includes a planar film.

In an embodiment, the polymer dispersed liquid crystal film is attached over an entire image display surface of the display panel.

In an embodiment, the display panel includes a liquid crystal display ("LCD") panel or an organic light emitting diode ("OLED") display panel.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Hereinafter, embodiments of the present disclosure of invention will be described in more detail with reference to the accompanying drawings.

Although the present invention can be modified in various manners and have several embodiments, specific embodiments are illustrated in the accompanying drawings and will be mainly described in the specification. However, the scope of the embodiments of the present invention is not limited to the specific embodiments and should be construed as including all the changes, equivalents, and substitutions included in the spirit and scope of the present invention.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Some of the parts which are not associated with the description may not be provided in order to specifically describe embodiments of the present invention, and like reference numerals refer to like elements throughout the specification.

Hereinafter, configurations and features of the present invention will be described in detail with reference to exemplary embodiments of the present invention illustrated in the accompanying drawings.

Figure 1:
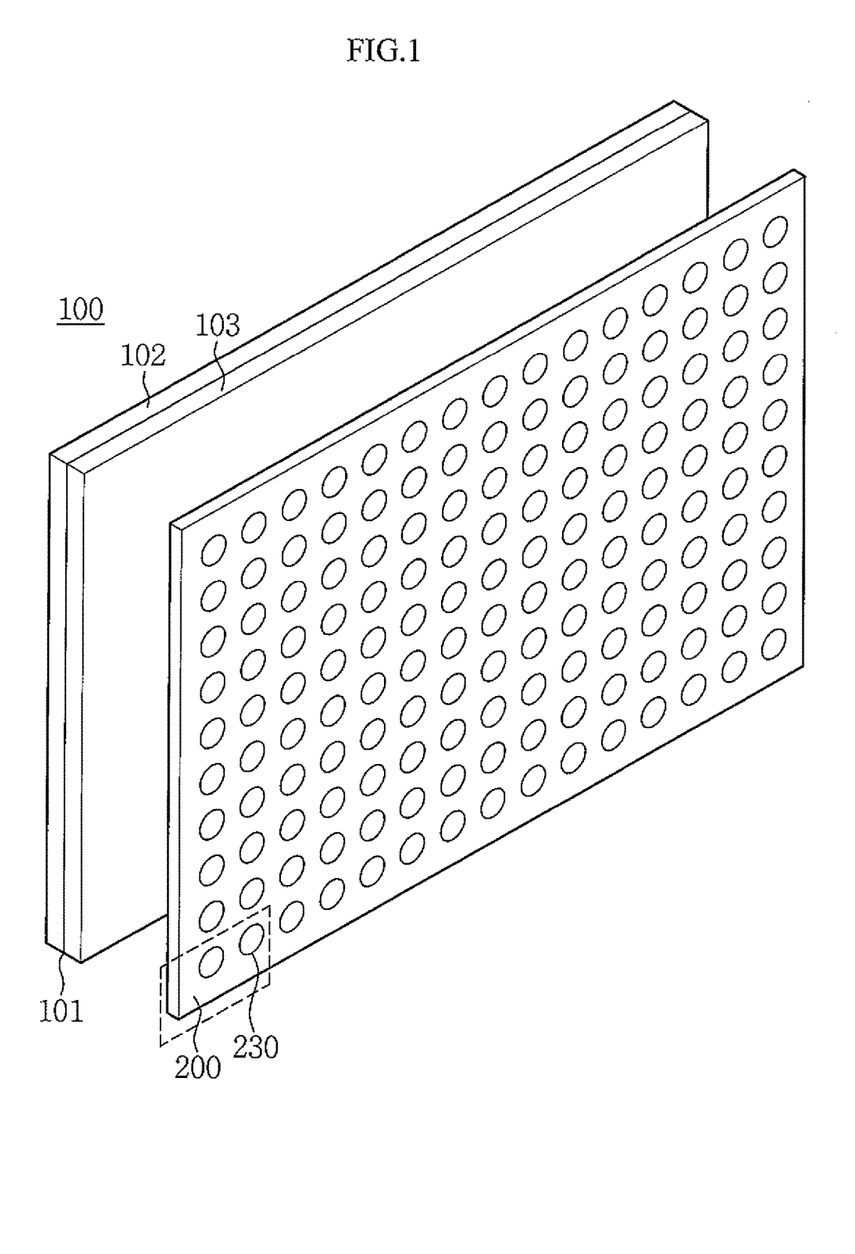
FIG. 1 is a perspective view illustrating a flat panel display ("FPD") device including a polymer dispersed liquid crystal film according to an exemplary embodiment of the present invention.

FIG. 1 is a perspective view illustrating a flat panel display ("FPD") device including a polymer dispersed liquid crystal film 200 according to an exemplary embodiment of the present invention.

In reference to FIG. 1, a display device 100 includes a flat display panel 101 and the polymer dispersed liquid crystal film 200. The flat display panel 101 illustrated in FIG. 1 refers to a display panel including a planar substrate such as an organic light emitting diode ("OLED") display panel, a liquid crystal display ("LCD") panel, an electronic-ink display panel, and the like. The flat display panel 101 includes a plurality of pairs of electric-field generating electrodes, and an electro-optical activation layer interposed therebetween.

The LCD panel includes a liquid crystal layer as the electric optical activation layer, and the OLED display panel includes an organic light emitting layer as the electric optical activation layer. The OLED display panel may represent (e.g., display) colors based on a principle in which holes and electrons injected from an anode electrode and a cathode electrode, respectively, are combined together in a light emitting unit to emit light. The OLED display panel has a stacked structure in which the light emitting layer is interposed between the anode electrode, which is a pixel electrode, and the cathode electrode, which is an opposing electrode. The OLED display panel includes a thin film transistor substrate 102 including the organic light emitting layer and an encapsulation substrate 103 configured to protect (e.g., to isolate) the organic light emitting layer from external air. The encapsulation substrate 103 may include a glass substrate, a thin film, and/or the like.

The polymer dispersed liquid crystal film 200 (hereinafter, "liquid crystal film") is an optical film for improving (e.g., increasing) a viewing angle of the FPD device. Among different types of the FPD device, the OLED display panel, in particular, employs a resonance structure to improve (e.g., increase) efficacy of light emitted from the organic light emitting layer through the substrate. Due to the resonance structure, a phenomenon of wavelength shift occurs in the emitted light, and thereby variation of display colors may be observed. Further, viewing angle properties may be improved by mixing the lights emitted from the display panel through the use of a lens array film, according to an exemplary embodiment.

The liquid crystal film 200 includes a resin base within which polymer dispersed liquid crystal particles (PDLC particles, hereinafter "liquid crystal particle") are dispersed. The resin base and the liquid crystals dispersed within the resin base have different refractive indices from each other, and the liquid crystal film 200 has portions having different refractive indices from one another due to a difference in a mixed amount of the liquid crystals, that is, due to a difference in density of the liquid crystals per unit volume of the resin base. The density of the liquid crystals dispersed within the resin base is uniform in a longitudinal direction (e.g., vertical direction) of the liquid crystal film 200, and exhibits variation in a transverse direction (e.g., a direction in which the liquid crystal film 200 extends). Accordingly, the refractive index of the liquid crystal film 200 is substantially constant (e.g., constant) in the longitudinal direction, and exhibits variation based on position in the transverse direction.

By gradually varying the density of the liquid crystals dispersed within the resin base, a difference in refractive indices may be adjusted in a planar film, and in such a manner, an optical lens 230 may be obtained. The optical lens 230 may have a function of light collimation or light distribution based on the difference in refractive index. The polymer dispersed liquid crystal film 200 includes the optical lens 230 arranged in an array form within the resin.

Figure 2:
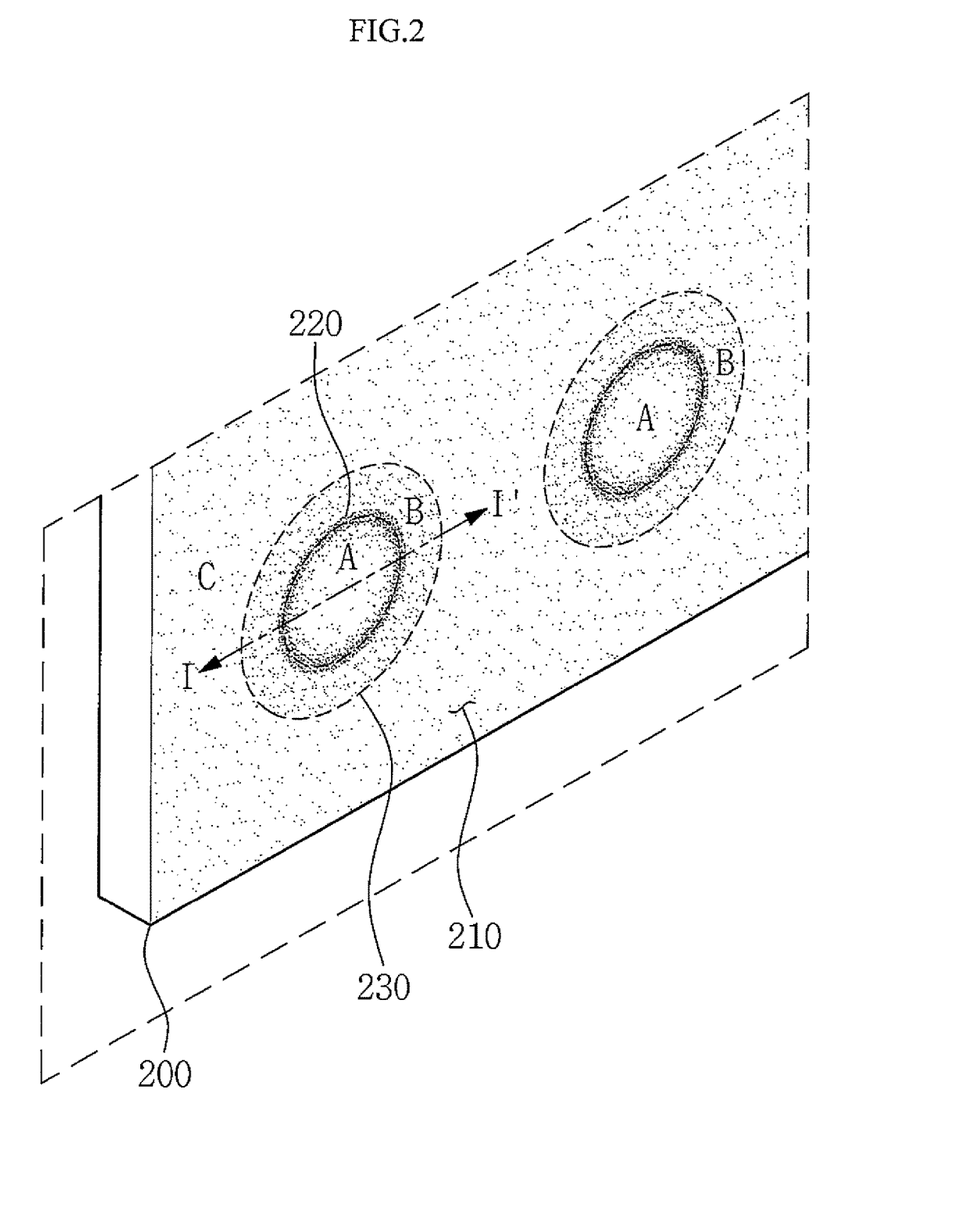
FIG. 2 is an enlarged perspective view illustrating a portion of the polymer dispersed liquid crystal film of FIG. 1.

FIG. 2 is an enlarged perspective view illustrating a portion of the liquid crystal film 200 of FIG. 1.

In reference to FIG. 2, the liquid crystal particles 220 are dispersed within the resin base 210. The optical lens 230 includes a first lens area A, having a circular shape, in which the density of the liquid crystal particles 220 increases from a center of the first lens area A toward an edge of the first lens area A, and a second lens area B, having a circular loop shape and surrounding the first lens area A, in which the density of the liquid crystal particles 220 decreases from a center, or inner edge, of the second lens area B toward an edge/outer edge of the second lens area B. The optical lenses 230 are disposed on the resin base 210 spaced from each other at a distance (e.g., a preset or predetermined distance). The optical lens 230 may have shapes other than the circular shape illustrated in FIG. 2. The optical lens 230 may be manufactured in various shapes, such as a polygonal shape or a star shape, and in an alternative exemplary embodiment, two or more types of optical lenses 230 that are different from each other may be provided to form an array.

The resin base of the liquid crystal film 200 is photocurable, and for example, may be cured by ultraviolet (UV) light. The photocurable resin may include oligomer, a monomer, a photopolymerization initiator, an additive, and/or the like. The oligomer may include an epoxy resin, acrylate, or the like, such as polyester-based acrylate, epoxy-based acrylate, urethane-based acrylate, polyether-based acrylate, and polyacrylic acrylate. The monomer may include a monofunctional monomer, a poly-functional monomer, an epoxy-based monomer, and/or the like. A refractive index of the photocurable resin may be in a range of about 1.45 to about 1.55.

The liquid crystal particles 220 are dispersed within the resin base 210 without having orientation, and have a diameter of about several nanometers. The refractive index of the liquid crystal particles 220 are in a range of about 1.55 to about 1.65 on average.

The refractive index of the optical lens 230 is determined by the refractive index of the resin base 210 and the refractive index of the liquid crystal particles 220 dispersed therein. In a case where the density of the liquid crystal particles 220 dispersed in a unit volume of the resin base 210 is higher, the refractive index is higher when compared to a case in which the density of the liquid crystal particles 220 is lower, which is because the refractive index of the liquid crystal particles 220 is higher than the refractive index of the resin base 210.

Through a pattern of the liquid crystal particles 220 dispersed within the resin base 210, the optical lens 230 may serve a function of light collimation or light distribution.

For example, in the first lens area A of the optical lens 230, the density of the liquid crystal particles 220 may increase from the center of the first lens area A toward the edge of the first lens area A. The refractive index is proportional to the density of the liquid crystal particles 220. Accordingly, the refractive index of the center portion may be lower than the refractive index of a peripheral portion in the first lens area A, and due to the difference in refractive index, the optical lens 230 may distribute (e.g. refract) the incident light.

However, the density of the liquid crystal particles 220 may, alternatively, decrease in the first lens area A from the center toward the edge of the first lens area A. In such an embodiment, the refractive index of the center portion may be higher than the refractive index of the peripheral portion in the first lens area A, and the optical lens 230 may collimate the incident light. By controlling the dispersion density of the liquid crystal particles 220, a planar film including a refractive-index lens may be obtained.

Figure 3:
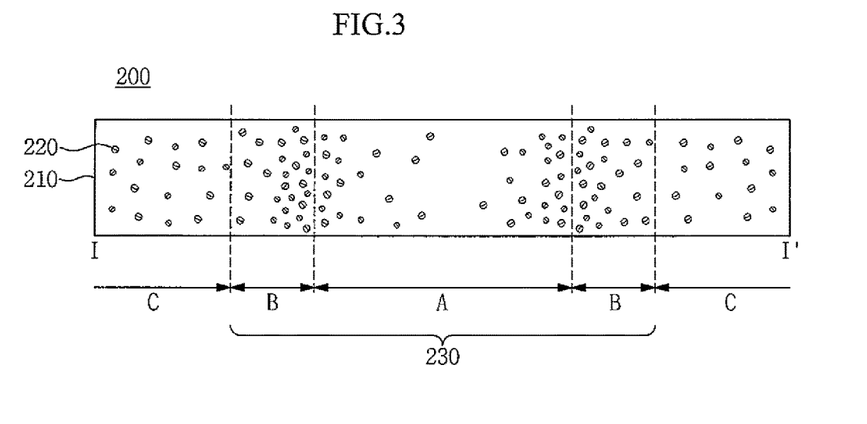
FIG. 3 is a cross-sectional view illustrating an optical lens taken along the line I-I' of FIG. 2.

FIG. 3 is a cross-sectional view illustrating the optical lens 230 taken along the line I-I' of FIG. 2.

In the first lens area A of the optical lens 230, the density of the liquid crystal particles 220 dispersed within the resin base 210 increases from the center toward the edge of the first lens area A. The second lens area B surrounding the first lens area A is a loop-shaped area in which the density of the liquid crystal particles 220 dispersed within the resin base 210 decreases from near the center of the second lens area B toward the edge of the second lens area B.

A base area C of the resin base 210 is positioned outwardly of the second lens area B of the optical lens 230, and includes liquid crystal particles 220 dispersed within the resin base 210 with a uniform density.

An interface between an outer portion/the outer edge of the first lens area A and an inner portion/inner edge of the second lens area B, being adjacently positioned to each other, may have a highest density of the liquid crystal particles 220 in the optical lens 230.

The refractive index of the resin base 210 is in a range of about 1.45 to about 1.55, and the refractive index of the liquid crystal particles 220 is in a range of about 1.55 to about 1.65.

Figure 4:
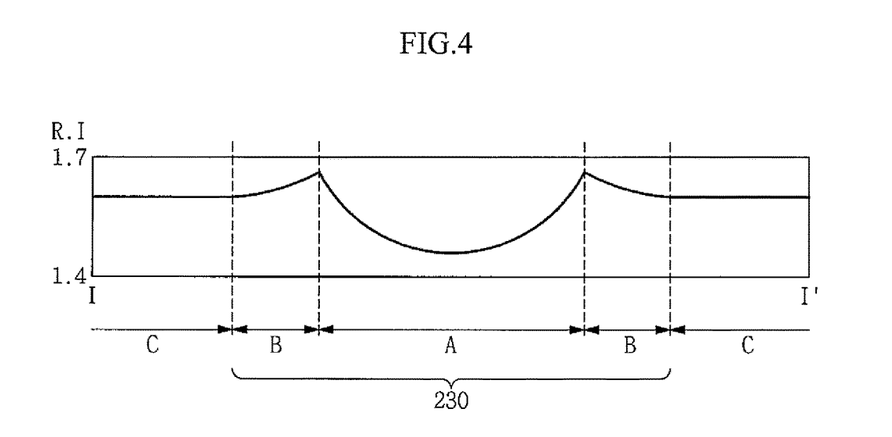
FIG. 4 is a graph illustrating a refractive index of portions of the optical lens corresponding to the cross-sectional view of FIG. 3.

FIG. 4 is a graph illustrating the refractive index of portions of the optical lens 230 corresponding to the cross-sectional view of FIG. 3.

In reference to FIG. 4, the center portion of the optical lens 230 in the first lens area A has a lowest refractive index of the liquid crystal particles 220 in the optical lens 230. Because liquid crystal particles 220 are scarcely dispersed in the center portion of the optical lens 230 as illustrated in FIG. 3, the center portion of the optical lens 230 has a refractive index in a range of about 1.45 to about 1.55, which is similar to the refractive index of the resin base 210. However, the density of the liquid crystal particles 220 increases from the center toward the edge of the first lens area A, such that the refractive index in the optical lens 230 increases along with the density of the liquid crystal particles 220. The refractive index gradually increases toward the outer portion of the first lens area A.

The second lens area B is a circular-loop-shaped area surrounding the first lens area A. The refractive index of the second lens area B is greatest at an inner side/inner edge of the second lens area B that is adjacent to the first lens area A, and decreases toward an outer side/outer edge of the second lens area B. A width of the second lens area B (e.g., a cross section of the second lens area B) is narrower than the width of the first lens area A.

The base area C is an area in which the liquid crystal particles 220 are uniformly dispersed within the resin base 210 to have a uniform refractive index. The refractive index of the base area C is determined based on an amount of the liquid crystal particles 220 dispersed within a corresponding area of the resin base 210.

The refractive index of the graph illustrated in FIG. 4 is a refractive index shown based on the density of the liquid crystal particles 220 dispersed within the resin base 210 forming the optical lens 230. Based on a variation pattern of the refractive index, a function of the optical lens 230 to collimate incident light or distribute the incident light may be achieved. The first lens area A forms an optical lens 230 in which the refractive index is relatively low in the center thereof and increases from the center toward the edge of the first lens area A. The incident light incident on the first lens area A is dispersed to be emitted throughout a relatively large area (e.g., is scattered throughout a large area). On the contrary, the second lens area B has a refractive index which is relatively high at an inner portion of the second lens area B and is relatively lower at an outer portion, such that the incident light is collimated in the second lens area B. In addition, the base area C has a substantially invariable refractive index due to the liquid crystal particles 220 being relatively uniformly dispersed therein, such that the incident light is neither collimated nor distributed (e.g., dispersed or scattered).

Figure 5A:
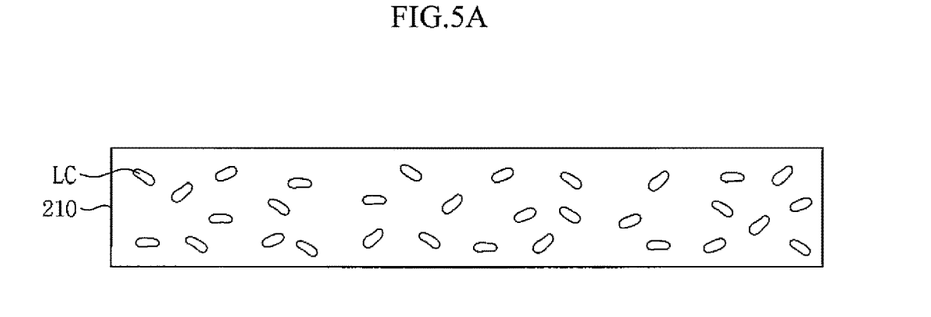
FIGS. 5A-5C are views illustrating processes of manufacturing the polymer dispersed liquid crystal film according to an exemplary embodiment of the present invention.
Figure 5B:
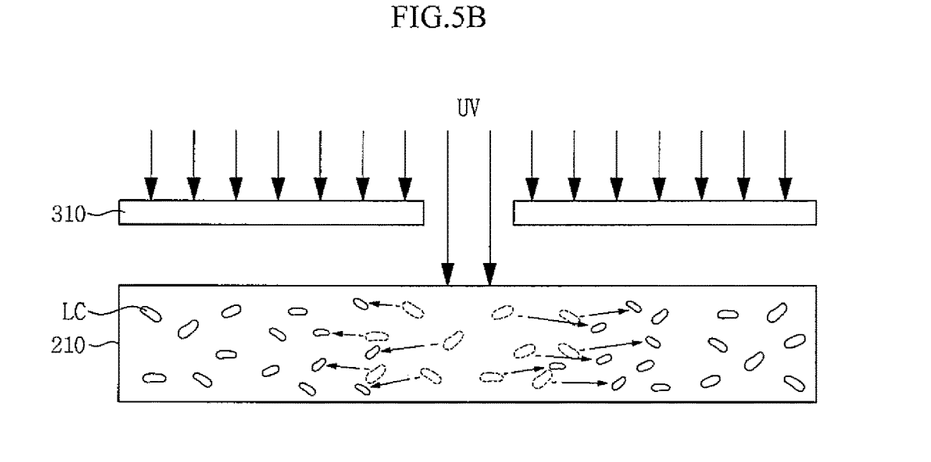
Figure 5C:
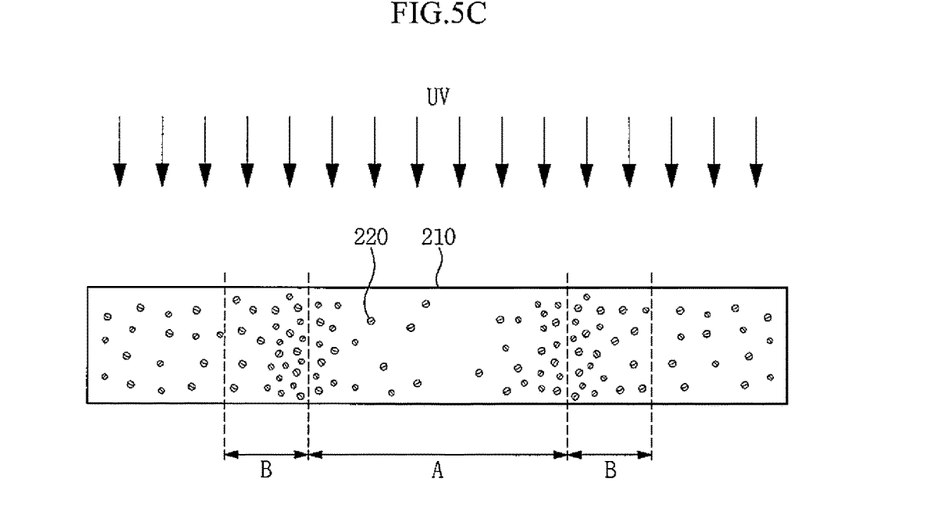

FIGS. 5A-5C are views illustrating processes of manufacturing the liquid crystal film 200 according to an exemplary embodiment of the present invention.

FIG. 5A is a cross-sectional view illustrating an optical film in which the resin base 210 and liquid crystals LC are uniformly distributed prior to curing. The resin base 210 illustrated in FIG. 5A has photocurability and fluidity. The resin base 210 includes oligomer, a monomer, a photopolymerization initiator, an additive, and/or the like. The resin base 210 and the liquid crystals LC are sufficiently mixed together, such that the liquid crystals LC are uniformly dispersed within the resin base 210. Transparent substrates may be disposed both above and below the resin base 210 before the resin base 210 is cured, such that the resin base 210 may maintain a film-like shape. The resin base 210 may have a thickness of about 100 µm or less so as to cause refraction of incident light. However, to enhance rigidity of the film, a transparent support film may further be coupled to the resin base 210.

An amount of the liquid crystals LC dispersed within the resin base 210 is in a range of about 20 wt % to about 40 wt %. Based on a content ratio of the liquid crystals LC, the size of the liquid crystal particles 220 varies. For example, in a case where the liquid crystals LC are provided in a relatively large amount, the size of the liquid crystal particles 220 increases, such that a light transmittance of the optical film decreases. In a case where the liquid crystals LC are mixed in an amount of about 20 wt % to about 40 wt %, the liquid crystal particles 220 may have a diameter of about several nanometers, such that transparency of the liquid crystal film may be enhanced (e.g., increased).

FIG. 5B is a mimetic diagram illustrating a process of irradiating UV light to an area of the liquid crystal film.

UV light is partially irradiated, at a high intensity, to an area corresponding to the center of the optical lens 230, which is formed of the resin base 210 having photo-curability, such that a portion of the liquid crystal film may be cured. To irradiate the UV light to a portion of the liquid crystal film, a mask 310 may be used. The mask 310 may use various types of masks, such as a slit mask, a shadow mask, and a gray-tone mask. Partial curing may also be performed using UV laser, other than using the mask 310.

The UV light is not blocked by the mask 310 in the center portion of the optical lens 230, but the UV light is blocked by the mask 310 in a peripheral portion surrounding the center portion. In the resin base 210, in the center portion that is exposed to the UV light, curing is performed and the density of an inner resin structure increases, such that a space for the liquid crystals LC is reduced within the resin base 210. The liquid crystals LC dispersed within the resin base 210 in the center portion, which is exposed to the UV light, gradually move to the peripheral portion that is not cured. The resin base 210 in an area that is not exposed to the UV light has fluidity, and thus is capable of further including liquid crystals LC flowing from the center portion. Due to the movement of the liquid crystals LC, the density of the liquid crystals LC in the portion exposed to the UV light decreases, and the density of the liquid crystals LC in the peripheral portion increases.

The partial light exposure may be achieved by irradiating the UV light to the center portion concentrically. Alternatively, a mask pattern that allows an amount of light exposure to gradually decrease from the center portion to the peripheral portion may be used. The dispersion pattern of the liquid crystals LC based on the partial light exposure may be controlled based on intensity, range, and time of the light exposure.

FIG. 5C illustrates a process of curing an entire surface of the resin base 210 having the liquid crystal dispersion pattern based on the partial light exposure illustrated in FIG. 5B. During the curing process of the entire surface, the entire surface of the resin base 210 including the liquid crystals LC is exposed to UV light. Curing is concurrently (e.g., simultaneously) performed throughout the entire portion of the resin base 210, and the liquid crystals LC are changed to the liquid crystal particles 220 having a size of several nanometers. Dissimilar to the partial curing of FIG. 5B, the entire portion of the resin base 210 may be concurrently (e.g., simultaneously) cured, and thus movement of the liquid crystals LC is absent within the resin base 210. As a result, through the light exposure to the entire portion, the optical film including liquid crystal particles 220 having a diameter of about several nanometers may be manufactured, while the dispersion pattern of the liquid crystals LC may be maintained.

The multi-step light exposure illustrated in FIGS. 5A-5C controls the density of the liquid crystal particles 220 dispersed within the resin base 210 to manufacture the refractive-index lens. In this regard, the dispersion of the liquid crystal particles 220 included within the resin base 210 is adjusted without changing an exterior shape of the resin base 210 in the process of manufacturing the optical film. Thereby, the optical film including a refractive-index lens having different refractive indices based on position of the optical film may be manufactured.

The optical film according to the present invention is manufactured through a light exposure process, and thus exhibits high accuracy and has a structure relatively readily manufactured. In the exemplary embodiment according to the present invention, the light exposure is performed in two steps by way of example, but the light exposure may be performed in three or more steps based on the material of the optical film and the shape of the lens to achieve the optical film.

As used herein, the "density" of the liquid crystal particles 220 refers to an average density of a unit volume (e.g., a predetermined unit volume), and the increase and decrease of the density refer to the tendency of the density. Although having the configuration according to the exemplary embodiments of the present invention, density variation in a partial area may not follow the tendency described herein.

As set forth hereinabove, aspects of exemplary embodiments of the present invention provide a viewing-angle improving film and a display device including a refractive-index lens.

From the foregoing, it will be appreciated that various embodiments in accordance with the present disclosure have been described herein for purposes of illustration, and that various modifications may be made without departing from the scope and spirit of the present teachings as defined by the appended claims and equivalents thereof. Accordingly, the various embodiments disclosed herein are not intended to be limiting of the true scope and spirit of the present teachings. Various features of the above described and other embodiments can be mixed and matched in any manner, to produce further embodiments consistent with the invention.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "below", "above", and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, and 35 U.S.C. § 132(a).

What is claimed is:

1. A polymer dispersed liquid crystal film comprising:
   an optical lens comprising a resin base and polymer dispersed liquid crystal particles within the resin base, and having:
      a first lens area having a higher refractive index at an outer edge of the first lens area than at a center of the first lens area, and having a lowest refractive index at the center of the first lens area; and
      a second lens area surrounding the first lens area and having a lower refractive index at an outer edge of the second lens area than at an inner edge of the second lens area adjacent to the outer edge of the first lens area,
      wherein the refractive index of the second lens area gradually decreases from the inner edge of the second lens area toward the outer edge of the second lens in all direction.

2. The polymer dispersed liquid crystal film of claim 1, wherein density of the polymer dispersed liquid crystal particles in the optical lens increases from the center of the first lens area toward the outer edge of the first lens area.

3. The polymer dispersed liquid crystal film of claim 1, wherein density of the polymer dispersed liquid crystal particles in the optical lens decreases from the inner edge of the second lens area toward the outer edge of the second lens area.

4. The polymer dispersed liquid crystal film of claim 1, wherein polymer dispersed liquid crystal particles in a base area between the optical lens and an other optical lens have a substantially uniform density.

5. The polymer dispersed liquid crystal film of claim 4, wherein the base area has a refractive index between a minimum refractive index of the first lens area of the optical lens and a maximum refractive index thereof.

6. The polymer dispersed liquid crystal film of claim 4, wherein the density of the polymer dispersed liquid crystal particles in the base area has a value between a minimum density of the optical lens and a maximum density thereof.

7. The polymer dispersed liquid crystal film of claim 4, wherein a thickness of the optical lens is about 100 μm or less.

8. The polymer dispersed liquid crystal film of claim 1, wherein the resin base is photocurable.

9. The polymer dispersed liquid crystal film of claim 8, wherein the resin base comprises at least one of polyester, epoxy, urethane, polyether, and polyacryl.

10. The polymer dispersed liquid crystal film of claim 9, wherein a dispersibility of the polymer dispersed liquid crystal particles is in a range of about 20 wt % to about 40 wt %.

11. A flat panel display device comprising:
    a polymer dispersed liquid crystal film comprising an optical lens, the optical lens comprising a resin base and polymer dispersed liquid crystal particles dispersed within the resin base; and
    a display panel attached to the polymer dispersed liquid crystal film,
    wherein the optical lens has:
       a first lens area having a higher refractive index at an outer edge of the first lens area than at a center of the first lens area, and having a lowest refractive index at the center of the first lens area; and a second lens area surrounding the first lens area, and having a lower refractive index at an outer edge of the second lens area than at an inner edge of the second lens area adjacent to the outer edge of the first lens area, and wherein the refractive index of the second lens area gradually decreases from the inner edge of the second lens area toward the outer edge of the second lens in all direction.

12. The flat panel display device of claim 11, wherein a base area between the optical lens and an other optical lens has a uniform refractive index.

13. The flat panel display device of claim 12, wherein optical lenses comprising the optical lens and the other optical lens are arranged in an array form within the polymer dispersed liquid crystal film.

14. The flat panel display device of claim 12, wherein the resin base comprises a photocurable resin.

15. The flat panel display device of claim 14, wherein the resin base is cured through at least two light exposures.

16. The flat panel display device of claim 15, wherein the resin base is partially cured using a mask one or more times.

17. The flat panel display device of claim 11, wherein the polymer dispersed liquid crystal film comprises a planar film.

18. The flat panel display device of claim 17, wherein the polymer dispersed liquid crystal film is attached over an entire image display surface of the display panel.

19. The flat panel display device of claim 18, wherein the display panel comprises a liquid crystal display ("LCD") panel or an organic light emitting diode ("OLED") display panel.

* * * * *